United States Patent
Ominami et al.

(10) Patent No.: US 9,263,232 B2
(45) Date of Patent: Feb. 16, 2016

(54) CHARGED PARTICLE BEAM DEVICE

(71) Applicant: Hitachi High-Technologies Corporation, Tokyo (JP)

(72) Inventors: Yusuke Ominami, Tokyo (JP); Shinsuke Kawanishi, Tokyo (JP); Tomohisa Ohtaki, Tokyo (JP); Masahiko Ajima, Tokyo (JP); Sukehiro Ito, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/395,263

(22) PCT Filed: Apr. 11, 2013

(86) PCT No.: PCT/JP2013/060914
§ 371 (c)(1),
(2) Date: Oct. 17, 2014

(87) PCT Pub. No.: WO2013/157474
PCT Pub. Date: Oct. 24, 2013

(65) Prior Publication Data
US 2015/0129763 A1 May 14, 2015

(30) Foreign Application Priority Data
Apr. 20, 2012 (JP) .................. 2012-097086

(51) Int. Cl.
*H01J 37/26* (2006.01)
*G21K 5/04* (2006.01)
(Continued)

(52) U.S. Cl.
CPC .............. *H01J 37/261* (2013.01); *H01J 37/09* (2013.01); *H01J 37/10* (2013.01); *H01J 37/147* (2013.01);
(Continued)

(58) Field of Classification Search
USPC ...... 250/396 R, 397, 396 ML, 306, 307, 309, 250/310, 311
See application file for complete search history.

(56) References Cited

U.S. PATENT DOCUMENTS

| | | |
|---|---|---|
| 2006/0249677 A1 | 11/2006 | Chao et al. |
| 2010/0140470 A1 | 6/2010 | Shachal |
| 2010/0224780 A1* | 9/2010 | Spruck ............... G02B 21/0004 250/309 |

FOREIGN PATENT DOCUMENTS

| | | |
|---|---|---|
| JP | 11-185682 A | 7/1999 |
| JP | 2004-31207 A | 1/2004 |

(Continued)

OTHER PUBLICATIONS

International Search Report (PCT/ISA/210) dated May 21, 2013, including English Translation (four (4) pages).

(Continued)

*Primary Examiner* — Nicole Ippolito
(74) *Attorney, Agent, or Firm* — Crowell & Moring LLP

(57) ABSTRACT

A charged particle beam device (1) includes a charged particle optical lens barrel (10), a support housing (20) equipped with the charged particle optical lens barrel (10) thereon, and an insertion housing (30) inserted in the support housing (20). A first aperture member (15) is disposed in the vicinity of the center of the magnetic field of an objective lens, and a second aperture member (15) is disposed so as to externally close an opening part provided at the upper side of the insertion housing (30). Further, when a primary charged particle beam (12) is irradiated to a sample (60) arranged under the lower side of the second aperture member (31), secondary charged particles thus emitted are detected by a detector (16).

15 Claims, 7 Drawing Sheets

(51) Int. Cl.
*H01J 37/16* (2006.01)
*H01J 37/18* (2006.01)
*H01J 37/28* (2006.01)
*H01J 37/09* (2006.01)
*H01J 37/10* (2006.01)
*H01J 37/147* (2006.01)

(52) U.S. Cl.
CPC ............... *H01J 37/16* (2013.01); *H01J 37/18* (2013.01); *H01J 37/28* (2013.01); *H01J 2237/0245* (2013.01); *H01J 2237/043* (2013.01); *H01J 2237/063* (2013.01); *H01J 2237/10* (2013.01); *H01J 2237/162* (2013.01); *H01J 2237/164* (2013.01); *H01J 2237/2003* (2013.01); *H01J 2237/2448* (2013.01); *H01J 2237/2602* (2013.01); *H01J 2237/2605* (2013.01)

(56) References Cited

FOREIGN PATENT DOCUMENTS

| | | |
|---|---|---|
| JP | 2006-147430 A | 6/2006 |
| JP | 2006-318903 A | 11/2006 |
| JP | 2007-188821 A | 7/2007 |
| JP | 2009-289468 A | 12/2009 |
| JP | 2010-509709 A | 3/2010 |

OTHER PUBLICATIONS

Written Opinion (PCT/ISA/237) dated May 21, 2013, (five (5) pages).

\* cited by examiner

CHARGED PARTICLE BEAM DEVICE

TECHNICAL FIELD

The present invention relates to a charged particle beam device which realizes magnification observation of a micro region of a sample in a state that most of the sample targeted for observation is exposed to atmospheric pressure.

BACKGROUND ART

When observing a micro region of a sample in a magnified fashion, used is a typical charged particle beam device such as a SEM (Scanning Electron Microscope) or a TEM (Transmission Electron Microscope). In observation via a SEM or a TEM, a sample targeted for observation is put in a sample room of which entire part is evacuated, and a micro region of the sample is observed in high vacuum.

Meanwhile, there is a great demand for observing a micro region of a sample under atmospheric pressure in use of a SEM or a TEM. For example, Patent Literatures 1 and 2 disclose an example of a SEM which achieves observation of a micro region of a sample in a state that most of the sample is exposed to atmospheric pressure.

Regarding the SEM disclosed in Patent Literature 1, a sample room is not particularly provided, while instead a cylindrical shroud covering the lens barrel unit of the SEM is provided. Here, the cylindrical shroud is configured so that one side (or upper side) thereof is closed, while the other side (or lower side) thereof is open. The lens barrel unit is arranged on the closed upper side in the shroud. Hereby, if a sample targeted for observation is placed to close the open lower side of the shroud, the inside of the shroud becomes a closed space. This allows the inside of the shroud to be kept at a certain degree of vacuum when evacuating therein. Accordingly, under the above condition, it is possible to observe a micro region of the sample surface via irradiating an electron beam from the lens barrel unit to the sample surface. That is, according to the SEM disclosed in Patent Literature 1, it is possible to observe a micro region of the sample facing the inside of the shroud even in a state that most of the sample is exposed to atmospheric pressure.

Here, the SEM of Patent Literature 2 is slightly different in the structure from the SEM of Patent Literature 1. That is, the shroud (i.e., vacuum container) of Patent Literature 2 has a semi-spherical shape. However, both SEMs are essentially almost the same for observing a sample exposed to atmospheric pressure. Accordingly, in the SEM of Patent Literature 2, it is also possible to observe a micro region of a sample facing the inside of the shroud in a state that most of the sample is exposed to atmospheric pressure.

PRIOR ART REFERENCE

Patent Literature

Patent Literature 1: JP 2007-188821
Patent Literature 2: JP 2004-031207

SUMMARY OF THE INVENTION

Problems to be Solved by the Invention

Generally, for a typical charged particle beam device such as a SEM, a high degree of vacuum is required for a space in which a charged particle source and optical lenses or the like are arranged. This makes it impossible to set a vacuum degree of the space at atmospheric pressure at least when a high voltage is applied to the filament of the charged particle source and the optical lenses arranged in that space.

In the SEMs of Patent Literatures 1 and 2, both a sample targeted for observation and a shroud are used for securing a closed space in vacuo to irradiate an electron beam to the sample. In this regard, if a user changes an observing position of the sample, a vacuum degree inside the shroud results in decreasing down to atmospheric pressure. For this reason, in the case of the SEMs of Patent Literatures 1 and 2, a user has to stop a high-voltage power supply and a vacuum pump every time when changing an observing position of the sample, which needs a standby time for evacuating the shroud again. This feature makes the above mentioned SEMs not always user-friendly.

In view of the drawbacks in the prior art described hereinbefore, the present invention is directed to improvement in the user-friendliness of a charged particle beam device which allows a user to observe a sample exposed to atmospheric pressure.

Means for Solving the Problem

A charged particle beam device according to the present invention includes: a charged particle optical lens barrel accommodating a charged particle source and electron lenses; a support housing equipped with the charged particle optical lens barrel on an upper side thereof and having an opening part at a lateral side thereof; and an insertion housing with an opening part at a lateral side thereof and being inserted in the support housing so that the opening part of the insertion housing is positioned in a same direction as the opening part of the support housing to face each other, thereby to close the opening part of the support housing.

The charged particle beam device further includes: a first aperture member having a small aperture at a central part thereof and disposed in a vicinity of a center of a magnetic field of an objective lens among the electron lenses in the charged particle optical lens barrel so as to isolate the space housing the charged particle source; a second aperture member having a small aperture at a central part thereof and disposed on an upper side of an inside of the insertion housing so as to externally close an opening part provided at a region to which the primary charged particle beam is irradiated in a state that the insertion housing is inserted in the support housing; and a detector that detects secondary charged particles emitted from a sample when the primary charged particle beam emitted from the charged particle source passes through the small aperture of the first aperture member and the small aperture of the second aperture member so as to irradiate the sample placed in contact with or in a close vicinity of a lower side of the second aperture member.

Effect of the Invention

According to the present invention, it is possible to improve user-friendliness of a charged particle beam device which allows a user to observe a sample exposed to atmospheric pressure.

EMBODIMENT FOR CARRYING OUT THE INVENTION

Hereinafter, a description will be given in detail of the embodiments of the present invention with reference to the attached drawings.

First Embodiment

Figure 1:
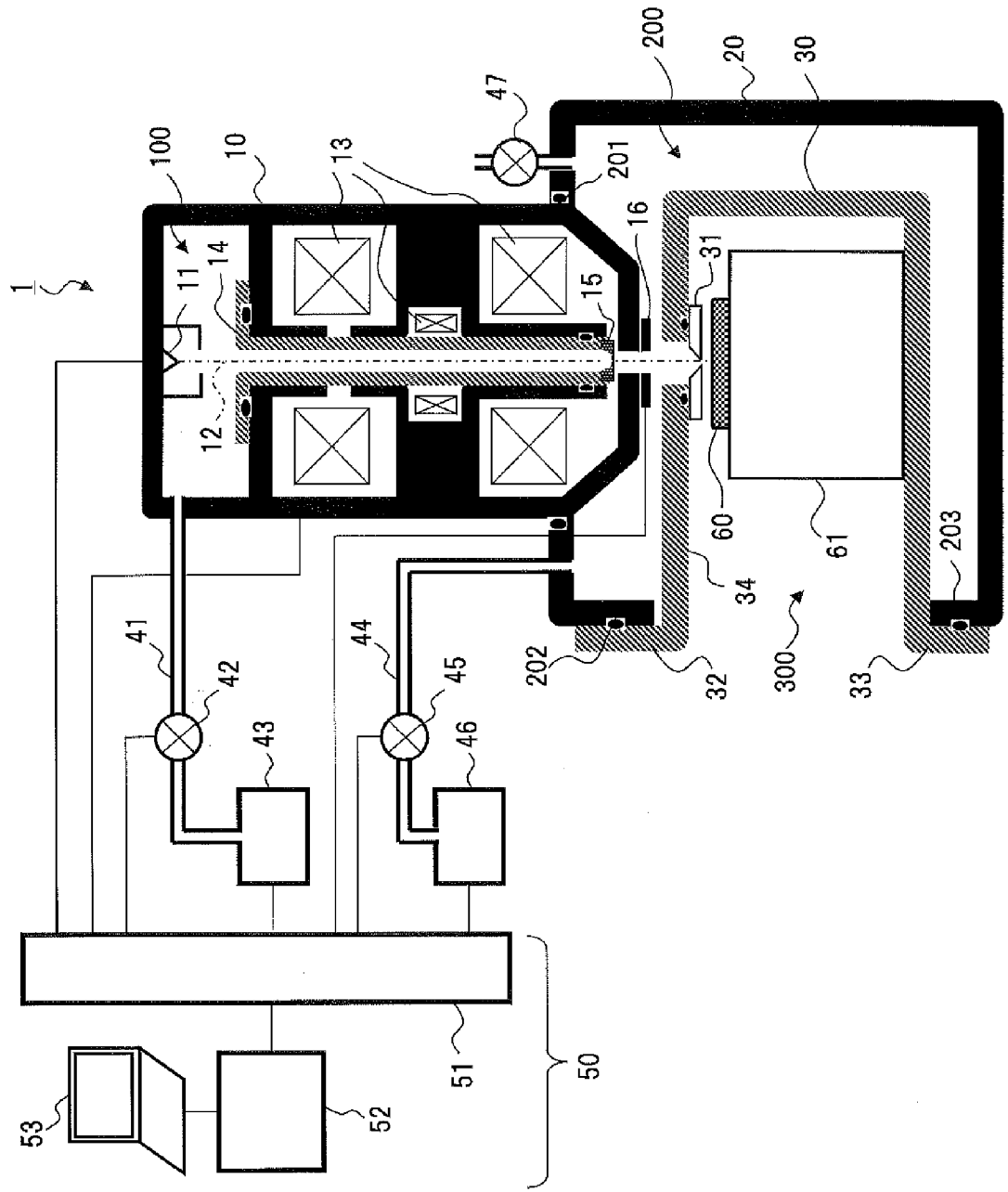
FIG. 1 is a diagram schematically showing an example of the configuration of a charged particle beam device according to a first embodiment of the present invention.

FIG. 1 is a diagram schematically showing an example of the configuration of a charged particle beam device according to a first embodiment of the present invention. As shown in FIG. 1, a charged particle beam device 1 is configured to include a charged particle optical lens barrel 10 that works as a charged particle irradiating unit to emit and irradiate a primary charged particle beam, a support housing 20 that supports the charged particle optical lens barrel 10, an insertion housing 30 that is used as inserted in the support housing 20, and a control system device 50 that controls those components.

Note that the charged particle beam device 1 is generally called an electron microscope when the primary charged particle beam is an electron beam. Similarly, the device 1 is called an ion beam microscope when the primary charged particle beam is an ion beam.

The support housing 20 is a hexahedral or cylindrical housing having a large opening part formed at the upper side, and another large opening part formed at the lateral side respectively of the housing. Herein, the charged particle optical lens barrel 10 is arranged so as to close and seal the opening part at the upper side of the support housing 20. In addition, the insertion housing 30 is inserted in the support housing 20 through the opening part formed at the lateral side of the support housing 20, so as to close and seal that opening part.

Here, the insertion housing 30 is a hexahedral or cylindrical housing having an opening part formed at the same side as that of the opening part of the support housing 20. When the insertion housing 30 is inserted in the support housing 20 and closely fixed to the support housing 20, a space defined between the support housing 20 and the insertion housing 30 comes to be a closed space. Hereinafter, the closed space will be called a first space 200. In contrast, a space surrounded by the insertion housing 30 has the opening part formed at the same lateral side as in the support housing 20, thereby to be an atmospheric-pressure space. Hereinafter, that atmospheric-pressure space will be called a second space 300.

The charged particle optical lens barrel 10 is configured to include a charged particle source 11 that emits a primary charged particle beam, a plurality of electron lenses 13 that accelerate, deflect, scan, and converge the primary charged particle beam emitted from the charged particle source 11 along a light axis 12, and the like. Further, at the central parts of the electron lenses 13 through which the primary charged particle beam passes, a circular tube member 14 penetrating from an upper-part electron lens 13 to a lowermost-part electron lens 13 (i.e., objective lens) 13 is inserted to be fitted. Furthermore, a first aperture member 15 having a small aperture that allows the primary charged particle beam to pass through the central part of the member 15 is disposed on the lower end of the circular tube member 14.

Hereinafter, in the embodiment, a space in which the primary charged particle beam is emitted from the charged particle source 11 and accelerated, including a space inside the circular tube member 14 will be called a charged particle generation space 100. The charged particle generation space 100 is communicated with a vacuum pump 43 via vacuum piping 41 including a vacuum valve 42, and evacuated by the vacuum pump 43.

The charged particle optical lens barrel 10 is provided so that a part of the barrel 10 protrudes from the upper part of the support housing 20 to the inside thereof, i.e., the inside of the first space 200. Hereby, the barrel 10 is closely fixed to the support housing 20 via a vacuum sealing member 201. In this arrangement, the charged particle optical lens barrel 10 is mounted so that the charged particle source 11 is placed at the upper part in the barrel 10. Accordingly, the primary charged particle beam is irradiated in a downward direction toward the inside (i.e., first space 200) of the support housing 20.

Further, a detector 16 is disposed on the outside of the lower end of the charged particle optical lens barrel 10 (i.e., inside the first space 200). The detector 16 detects secondary charged particles such as secondary electrons and reflection electrons emitted from a sample 60 when the primary charged particle beam is irradiated to the sample 60.

Note that a position at which the detector 16 is disposed is not limited to the outside of the lower end of the charged particle optical lens barrel 10 shown in FIG. 1, but the detector 16 may be disposed inside the charged particle optical lens barrel 10. Alternatively, the detector 16 may be disposed on the outside of the first space 200, i.e., in the second space 300 of the insertion housing 30 as occasion demands.

Here, the space formed between the support housing 20 and the insertion housing 30, i.e., the first space 200 is communicated with a vacuum pump 46 via vacuum piping 44 including a vacuum valve 45, and evacuated by the vacuum pump 46. In addition, the support housing 20 is provided with a leak valve 47 that allows the inside of the support housing 20 to be opened to air. The first space 200 is open to the air during maintenance or the like.

The insertion housing 30 is constituted of a hexahedral or cylindrical insertion part 34 having the opening part at the lateral side thereof, a mating part 32 and a holding part 33 provided on the periphery of the opening part. The insertion part 34 is inserted in the support housing 20 in its entirety to accommodate the sample 60 targeted for observation and a sample stage 61. Here, the mating part 32 and the holding part 33 work as mating faces to the outside wall of the periphery of the opening part of the support housing 20. Hereby, the mating part 32 and the holding part 33 are closely fixed to the outside wall via vacuum seal members 202 and 203.

In addition, on the upper side of the insertion part 34 of the insertion housing 30, an opening part is provided in the vicinity of a position through which the light axis 12 of the primary charged particle beam passes. At the opening part, a second aperture member 31 having a small aperture at the central part thereof is disposed. Herein, the second aperture member 31 is attached so that the light axis 12 passes through the center of the small aperture.

Here, FIG. 1 is drawn such that a gap exists between the sample 60 and the second aperture member 31. However, when the primary charged particle beam is irradiated to the sample 60 for observing the front surface of the sample 60, the sample 60 is brought into intimate contact with or brought in close vicinity to the second aperture member 31. When the sample 60 is brought into intimate contact with the second aperture member 31, the front surface of the sample 60 is brought into contact with the vacuumed first space 200.

Therefore, in the embodiment, the sample stage 61 on which upper side the sample 60 is placed is configured such that at least the height position of the upper side can be adjusted or controlled. That is, the interval between the sample 60 and the second aperture member 31 can be appropriately adjusted based on instructions of a personal computer 53 or the like to which a user inputs data.

Meanwhile, in the charged particle beam device 1 configured as described above, a space below the underside of the second aperture member 31 is under atmospheric pressure. Therefore, the first space 200, i.e., the space formed between the support housing 20 and the insertion housing 30, is not completely sealed due to the small aperture provided in the second aperture member 31. That is, in a state that at least the sample 60 is not brought into intimate contact with the second aperture member 31, the first space 200 is brought into a differential pumping state in which the first space 200 is evacuated by the vacuum pump 46 while air is sucked via the small aperture of the second aperture member 31.

Accordingly, in the embodiment, in order to bring the first space 200 into a vacuum state by differential pumping, the small aperture of the second aperture member 31 is needed to be substantially small in size. Note that it has been experimentally confirmed that a vacuum degree of 1 Pa or less is substantially secured under the differential pumping state if the diameter of the small aperture of the second aperture member 31 is 0.1 to 1 mm or less when a general small or medium sized vacuum pump having a pumping speed at about several tens to several hundreds L/min is used as the vacuum pump 46.

According to the configuration described above, the primary charged particle beam emitted from the charged particle source 11 passes through the small apertures of the first aperture member 15 and the second aperture member 31 and reaches the front surface of the sample 60. In addition, secondary charged particles emitted from the sample 60 by the irradiation of the primary charged particle beam pass through the aperture of the second aperture member 31 and reach the detector 16 to be detected thereby. Further, most of the space in which the processes described above are performed can be regarded as being under vacuum.

That is, in the charged particle beam device 1 according to the embodiment, most of the primary charged particle beam emitted from the charged particle source 11 passes through the evacuated space (i.e., the charged particle generation space 100 and the first space 200) except for the vicinity of the front surface of the sample 60. In addition, most of the secondary charged particles emitted from the sample 60 also pass through the evacuated first space 200 and reach the detector 16. Accordingly, in the embodiment, an influence such as the scattering of the primary charged particle beam due to air molecules can be reduced. Therefore, a clearer observation image is obtained although most of the sample 60 is exposed to atmospheric pressure.

Note that in the above description, the vacuum pump 43 evacuates the charged particle generation space 100, and the vacuum pump 46 evacuates the first space 200. However, the configuration of the arrangement of the vacuum pump 43 is not limited to this. For example, three or more vacuum pumps may be disposed, or one vacuum pump may serve as the vacuum pumps 43 and 46. Further, the leak valve 47 may not be disposed, or two or more leak valves may be disposed.

Moreover, as shown in FIG. 1, the control system device 50 is configured to include a lower-level control unit 51, an upper-level control unit 52, the personal computer 53, and the like.

The lower-level control unit 51 is configured to include a control circuit that generates control signals to separately control the vacuum pumps 43 and 46, the charged particle source 11, the electron lenses 13, or the like, an amplification circuit that amplifies a detection signal detected by the detector 16, a signal processing circuit that converts the detection signal amplified by amplification circuit into a digital image signal and transmits the converted detection signal to the upper-level control unit 52, or the like.

The upper-level control unit 52 is constituted of, for example, a general control computer or the like and transmits control information for integrally controlling the charged particle source 11, the electron lenses 13, the vacuum pumps 43 and 46, or the like to the lower-level control unit 51 according to various observation conditions set by the user via the personal computer 53. In addition, the upper-level control unit 52 receives a digital image signal from the lower-level control unit 51 and transmits the received digital image signal to the personal computer 53 while storing the same in a storage thereof as observation image data.

The personal computer 53 includes a keyboard, a mouse, or the like as an input device and a display device such as an LCD (Liquid Crystal Display) or the like as an output device. The personal computer 53 displays its operation screen (GUI: Graphical User Interface) on the display device when the user operates the charged particle beam device 1 and urges the user to input various observation conditions as occasion demands. Further, when receiving an observation image from the upper-level control unit 52, the personal computer 53 makes the received observation image displayed on the display device.

Note that the configuration of the control system device 50 is not limited to the above one. The upper-level control unit 52 and the lower-level control unit 51 may be integrated together as a single control device, or the upper-level control unit 52 and the personal computer 53 may be constituted of a single control computer. Moreover, the lower-level control unit 51 and the upper-level control unit 52 including the personal computer 53 may be constituted of dedicated digital and analog circuits, their mixed circuits, or the like so long as their given functions are fulfilled.

Further, in FIG. 1, communication lines via which the lower-level control unit 51, the upper-level control unit 52, and the personal computer 53 are connected to one another and control lines via which the lower-level control unit 51 is connected to the charged particle source 11, the electron lenses 13, the detector 16, the vacuum valves 42 and 45, the vacuum pumps 43 and 46, or the like are shown only for exemplarily describing the configurations. All the control lines and communication lines are not necessarily shown in FIG. 1.

Figure 2:
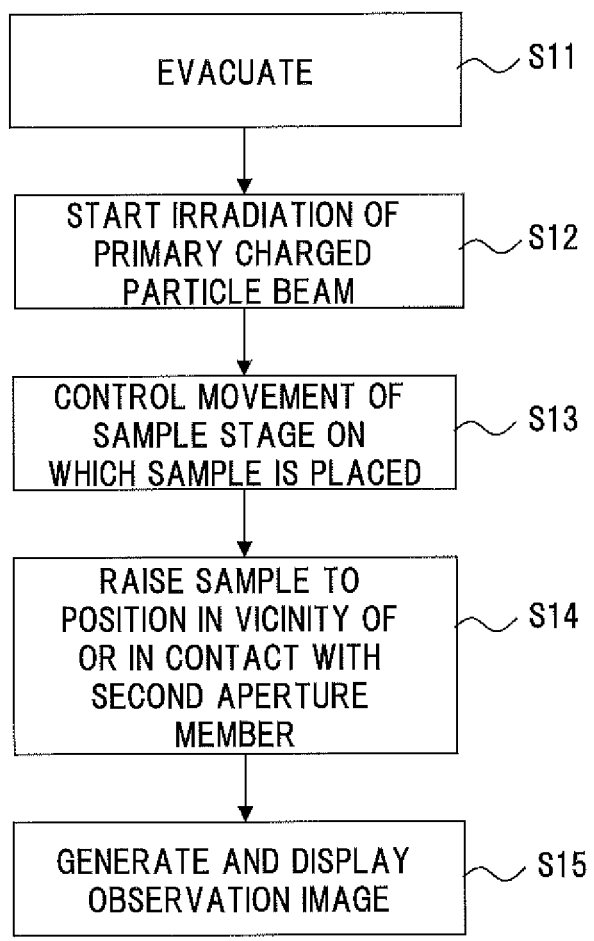
FIG. 2 is a diagram showing a procedure for obtaining an observation image via irradiation of a primary charged particle beam to a sample, by the charged particle beam device according to the first embodiment of the present invention.

FIG. 2 is a diagram showing a procedure for obtaining an observation image by the irradiation of a primary charged particle beam to the sample 60 in the charged particle beam device 1 according to the first embodiment.

The upper-level control unit 52 drives the vacuum pumps 43 and 46 via the lower-level control unit 51 to evacuate the charged particle generation space 100 and the first space 200 (step S11). Next, the upper-level control unit 52 supplies a voltage or a current for fulfilling observation conditions (such as magnification) previously set by the personal computer 53 to the charged particle source 11 and the electron lenses 13 via the lower-level control unit 51 to start the irradiation of a primary charged particle beam (step S12). After this time, an observation image of the sample 60 is in a state of being displayable on the display device of the personal computer 53.

Then, since the sample 60 is placed on the sample stage 61, the upper-level control unit 52 controls movement of the sample stage 61 via the lower-level control unit 51 such that an observation target region of the sample 60 is positioned right beneath the center of the small aperture of the second aperture member 31 (step S13). Moreover, the upper-level control unit 52 controls the sample stage 61 via the lower-level control unit 51 to raise the sample 60 to a position at which the sample 60 is brought in close vicinity to or brought in contact with the second aperture member 31 (step S14). As a result, most of the space in the vicinity of a part in which the front surface of the sample 60 faces the small aperture of the second aperture member 31 is put in a vacuumed state. On this occasion, the upper-level control unit 52 controls the lower-level control unit 51 to generate an observation image of the front surface of the sample 60 according to a detection signal obtained by the detector 16, whereby the generated observation image is displayed on the display device of the personal computer 53 (step S15).

Note that when replacing the sample 60 or moving the observation target region, the upper-level control unit 52 controls the distance between the sample 60 and the second aperture member 31 to be temporarily increased via the lower-level control unit 51. After the replacement of the sample 60 or the movement of the observation target region, the upper-level control unit 52 controls the sample 60 to be brought in close vicinity to or brought in contact with the second aperture member 31 again.

That is, in the embodiment, once the irradiation of the primary charged particle is started in step S12, steps S13 to S15 can be repeatedly performed without changing the state. This procedure enables that it is not required to stop the vacuum pumps 43 and 46 or it is not required to stop a high voltage supplied to the charged particle source 11 even if the observation target region of the sample 60 is changed or the sample 60 is replaced with another sample.

Accordingly, in the embodiment, it becomes possible to change the observation target region of the sample 60 or it becomes possible to replace the sample 60 without stopping the vacuum pumps 43 and 46 or without stopping the high voltage supplied to the charged particle source 11. Therefore, besides the elimination of the on/off operations of the vacuum pumps 43 and 46 and the high voltage power supply to change the observation target region or replace the sample 60, it is not required for the user to be on standby for time to perform vacuuming or time to stabilize a high voltage. As a result, the usability of the charged particle beam device 1 is greatly improved.

Meanwhile, when the sample 60 is brought into contact (i.e., intimate contact) with the second aperture member 31, the space (i.e., the first space 200) on the upper side of the second aperture member 31 is under vacuum, while the space (i.e., the second space 300) on the lower side of the sample 60 is under atmospheric pressure. Accordingly, it is likely that a great force is required to separate the sample 60 from the second aperture member 31. For the force required to separate the sample 60 from the second aperture member 31, a brief calculation example will be shown below.

Here, it is assumed that the diameter of the small aperture provided in the second aperture member 31 is 1 mm. Further, pressure caused between the first space 200 and the sample 60 is not taken into consideration with the assumption that such pressure is substantially smaller than atmospheric pressure.

In this case, a force $F_{air}$ applied to the sample 60 via the small aperture of an area A under atmospheric pressure $P_{air}$ is calculated as follows.

$$F_{air} = P_{air}[\text{N/m}^2] \times A[\text{m}^2]$$
$$= 10^5 \times (0.5 \times 10^{-3})^2 \times \pi$$
$$= 0.078[\text{N}]$$

Here, the symbol "N" represents Newton (the unit of a force), and "$\pi$" represents the ratio of a circumference.

On the other hand, if it is assumed that a mass "M" of the sample 60 is, for example, 10 g and the acceleration of gravity on the ground is $\alpha_G$, gravity $F_G$ applied to the sample 60 is calculated as follows.

$$F_G = M[\text{kg}] \times \alpha_G[\text{m/s}^2]$$
$$= 0.01 \times 9.8$$
$$= 0.098[\text{N}]$$

According to the calculation described above, the relational expression of "$F_{air} < F_G$" is established, which represents that the sample 60 separates and falls from the second aperture member 31 due to its own weight, if the sample 60 has a mass (weight) of only 10 g.

In contrast, the above calculation shows that the sample 60 does not separate and fall due to its own weight, if the sample 60 has a weight substantially smaller than 10 g. In this case, it is required to separate the sample 60 from the second aperture member 31 by applying a force to the sample in the direction from the sample stage 61. In such a case, for example, the sample stage 61 may be moved downward with the sample 60 fixed thereto by a double-faced tape or the like to separate the sample 60 from the second aperture member 31. In addition, if the sample 60 is one like a flat sheet or plate having rigidity, a fixation member for fixing the periphery of the sample 60 to the sample stage 61 may be provided on the upper side of the sample stage 61.

Note that the second aperture member 31 is desirably replaceable and formed to be easily detachable from the insertion housing 30 since a contaminated material is attached by the irradiation of the primary charged particle beam. Therefore, for example, by the provision of screw holes, fitting members, or the like for fixing the second aperture member 31 in the insertion housing 30, the second aperture member 31 may be fixed according to a method such as screwing and fitting.

In addition, the second aperture member 31 is desirably made of a conductive material and grounded to prevent a charge-up due to the irradiation of the primary charged particle beam.

Moreover, as shown in FIG. 1, at the central parts of the electron lenses 13 through which the primary charged particle beam passes, the thin circular tube member 14 penetrating from the upper-part electron lens 13 to the lowermost-part electron lens 13 is fitted. Further, at the lower end of the circular tube member 14, the first aperture member 15 having a small aperture with a diameter of about 1 mm or less at the central part thereof is disposed.

The circular tube member 14 and the first aperture member 15 allow the charged particle generation space 100, in which the charged particle source 11 is accommodated, to be kept at a high vacuum degree. That is, the circular tube member 14 isolates the charged particle generation space 100 from the space in which the electron lenses 13 such as magnetic field coils are arranged, and the first aperture member 15 isolates the charged particle generation space 100 from the first space 200, i.e., the space formed between the support housing 20 and the insertion housing 30.

Accordingly, the differential pumping performed in the charged particle generation space 100 by the vacuum pump 43 while the small aperture is provided at the central part of the first aperture member 15 enables the charged particle generation space 100 to be kept at a higher vacuum degree than the first space 200. More specifically, even if the first space 200 sucks air through the small aperture of the second aperture member 31 and its vacuum degree is reduced, the first aperture member 15 prevents the reduction in the vacuum degree of the charged particle generation space 100.

Note that the circular tube member 14 is made of a non-magnetic body. This is because the magnetic field coils of the electron lenses 13 are positioned outside the circular tube member 14, and their magnetic fields are formed inside the circular tube member 14.

In addition, the outside diameter of the circular tube member 14 is smaller than the inside diameters of the electron lenses 13, and the circular tube member 14 is formed to be capable of being inserted and extracted in a direction from above the electron lenses 13, i.e., from the charged particle source 11. Accordingly, the circular tube member 14 formed to be easily extracted toward the outside facilitates the first aperture member 15 to be also easily replaced.

In the charged particle beam device 1 according to the first embodiment configured as described above, the primary charged particle beam is emitted from the charged particle source 11 inside the charged particle optical lens barrel 10. The space (i.e., the charged particle generation space 100) through which the primary charged particle beam passes is isolated from the space (i.e., the first space 200) formed between the support housing 20 and the insertion housing 30 by the first aperture member 15 having the small aperture at the central part thereof. In addition, the space (i.e., the first space 200) formed between the support housing 20 and the insertion housing 30 is isolated from the space (i.e., the atmospheric pressure space: the second space 300) inside the insertion housing 30 by the second aperture member 31 having the small aperture at the central part thereof.

Here, each of the small apertures provided in the first aperture member 15 and the second aperture member 31 is sufficiently small. This allows the charged particle generation space 100 and the space (i.e., the first space 200) formed between the support housing 20 and the insertion housing 30 to be kept in vacuo via being evacuated by the vacuum pumps 43 and 46, respectively.

Accordingly, the primary charged particle beam emitted from the charged particle source 11 passes through the almost vacuum space to be irradiated to the sample 60 arranged in contact with or arranged in close vicinity to the lower side of the second aperture member 31. Then, the detector 16 detects the secondary charged particles thus emitted from the sample 60 by the irradiation achieved almost in vacuo. This enables a clear observation image of the sample 60 to be obtained.

Further, in the charged particle beam device 1 according to the embodiment, the sample 60 is arranged in the second space 300, i.e., the atmospheric pressure space. This facilitates the change of the observation target region of the sample 60 or the replacement of the sample 60 to be easily performed. Moreover, even when the observation target region of the sample 60 is changed or the sample 60 is replaced, there is no need for a user to interrupt the high voltage power supply to the charged particle optical lens barrel 10, nor to stop the vacuum pumps 43 and 46.

Modified Example of First Embodiment

Figure 3:
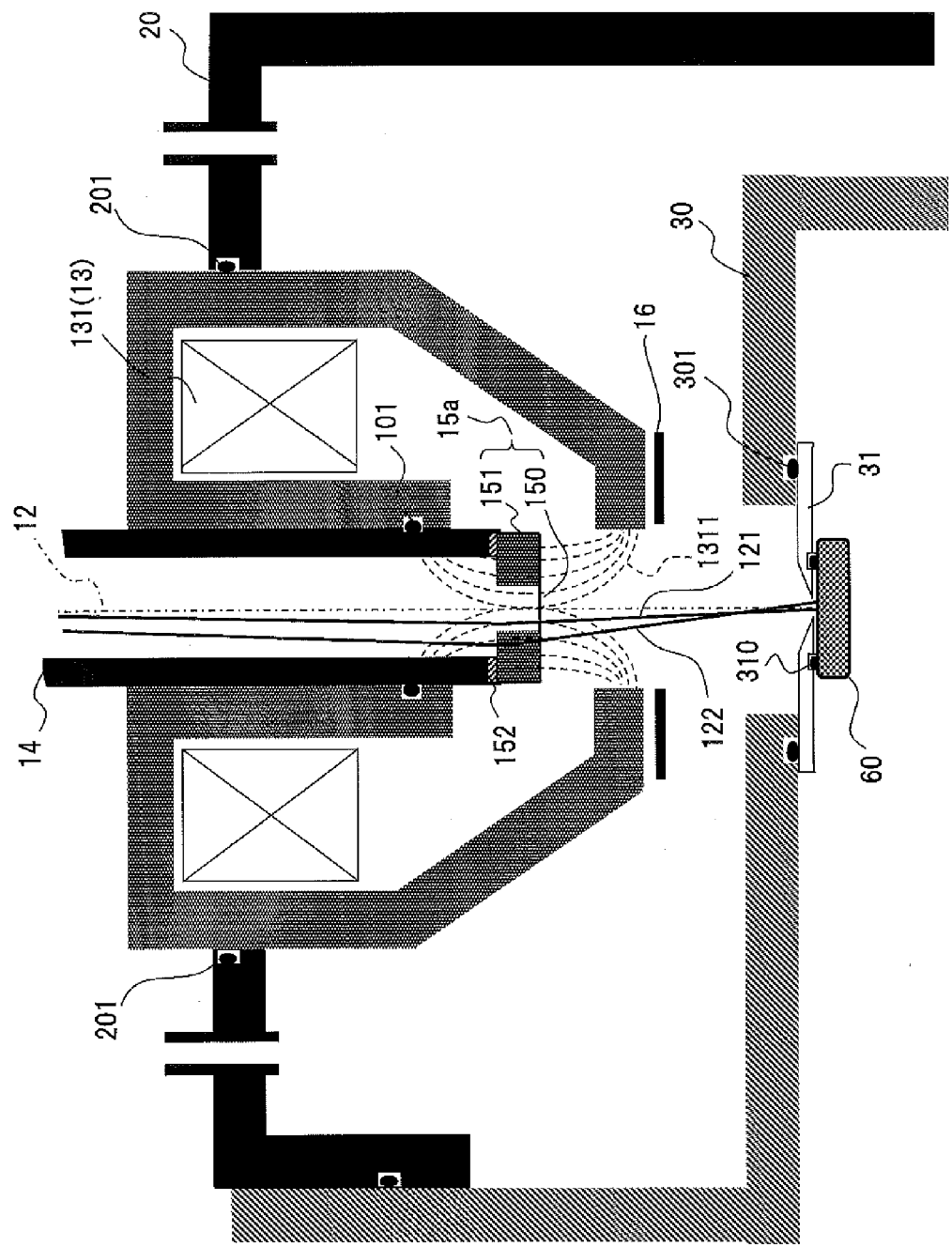
FIG. 3 is a diagram schematically showing an example of the configuration of the essential part of the charged particle beam device according to a modified example of the first embodiment of the present invention.

FIG. 3 is a diagram schematically showing a configuration of the essential part of the charged particle beam device 1 according to a modified example of the first embodiment of the present invention. As shown in FIG. 3, the modified example of the first embodiment is different in configuration from the first embodiment in that a diaphragm member 15a is used instead of the first aperture member 15 as a member for making the vacuum degree of the charged particle generation space 100 different from the vacuum degree of the first space 200. However, other configurations of the modified example are the same as those of the first embodiment.

That is, as shown in FIG. 3, the diaphragm member 15a is fixed to the lower end of the circular tube member 14 by a conductive adhesive 152. The diaphragm member 15a is constituted of a diaphragm holding member 151 having a substantially-circular small aperture at the central part thereof, and a diaphragm 150 composed of a thin film made from a material such as silicon and silicon oxide, arranged to close the small aperture.

That is, the diaphragm 150 is a passage through which the primary charged particle beam emitted from the charged particle source 11 passes. Herein, a thickness of the thin film constituting the diaphragm 150 should be made desirably thin. This is because the primary charged particle beam is scattered when the film thickness is too thick. Such scattering decreases the resolution of an observation image acquired by the control system device 50. However, according to experimental results by the inventors et al., even if the resolution of an observation image is decreased, it is determined that the allowable resolution to a user is achieved provided that the thickness of the thin film is about 100 nm or less.

Note that a material of the thin film constituting the diaphragm 150 is not limited to silicon and silicon oxide. The material may include, for example, silicon nitride, silicon carbide, carbon nanotube, epoxy resin, carbon fiber reinforced plastic, or the like.

In this modified example, the diaphragm member 15a described above is arranged at the center of a magnetic field 1311 of an objective lens 131 (see FIG. 3). In this case, the diaphragm member 15a exerts the following effects in the charged particle beam device 1.

First, like the first aperture member 15, the diaphragm member 15a functions as a member for isolating the charged particle generation space 100 from the first space 200. In addition, the diaphragm member 15a is just configured as having the diaphragm 150 (thin film) at the small aperture part of the first aperture member 15. Therefore, the charged particle generation space 100 can be more reliably isolated from the first space 200 by the diaphragm 150. Accordingly, even if air flows through the small aperture of the second aperture member 31, the charged particle generation space 100 can be maintained at a high vacuum degree.

Second, the diaphragm member 15a cuts off the primary charged particle beam deviating from the light axis 12, to work as an iris. As shown in FIG. 3, it is general that the track of the primary charged particle beam 122, which deviates from the light axis 12, is greatly changed by the strong magnetic field of the objective lens 131. Accordingly, the primary charged particle beam 122 deviating from the light axis 12 and a primary charged particle beam 121 passing through the vicinity of the light axis 12 focus on different positions. Therefore, the focal points of the respective primary charged particle beams 121 and 122 cannot be aligned with each other on the front surface of the sample 60 at the same time. This phenomenon is called spherical aberration.

In view of this problem, in the embodiment, the diaphragm member 15a having the diaphragm 150 smaller in size than the diameter of the circular tube member 14 is arranged at the lower end of the circular tube member 14 to be placed at the center of the magnetic field 1311 of the objective lens 131. This arrangement enables the primary charged particle beam 122 deviating from the light axis 12 to be interrupted by the diaphragm holding member 151. As a result, only the primary charged particle beam 121 passing through the vicinity of the light axis 12 passes through the diaphragm member 15a, allowing the spherical aberration to be decreased.

Note that the same effects as the above are, of course, exerted even by the first aperture member 15 of the first embodiment.

Next, a description will be supplementarily given of the adhesion between the sample 60 and the second aperture member 31 with reference to FIG. 3. In the first embodiment, the sample 60 is brought into contact with or brought in close vicinity to the second aperture member 31 as described hereinbefore. In this case, when the sample 60 is brought into contact with the second aperture member 31, it is assumed that the sample 60 adheres to the second aperture member 31 to prevent air from leaking from the contact region. However, if there are uneven spots on the front surface of the sample 60, air leakage is caused at the contact region between the sample 60 and the second aperture member 31, whereby the vicinity of the small aperture of the second aperture member 31, i.e., a space above the observation target region of the sample 60 is not likely to be substantially evacuated. In view of this problem, as shown in FIG. 3, a flexible member 310 such as rubber and a gasket may be provided at a place where the second aperture member 31 is brought into contact with the sample 60 so as to prevent the air leakage.

Figure 4:
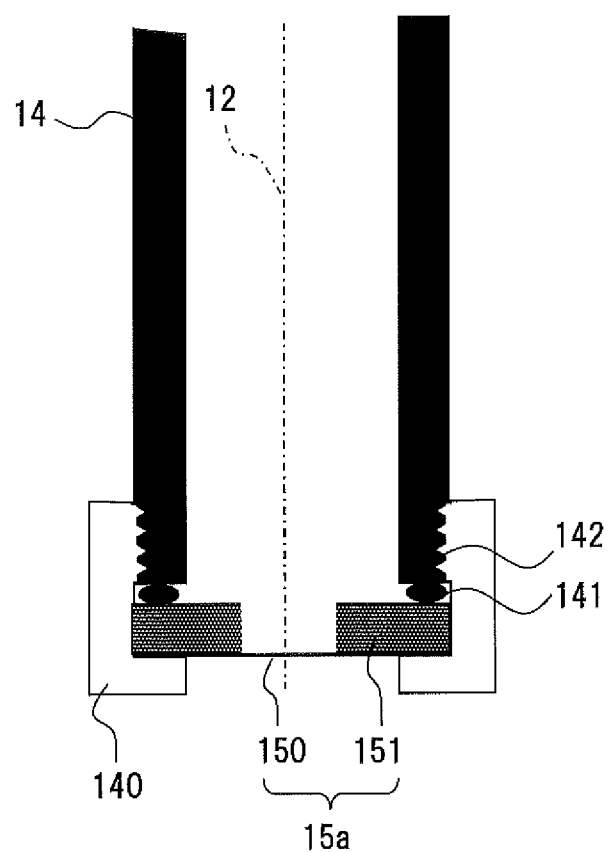
FIG. 4 is a diagram showing an example of a configuration in which a diaphragm member is attached to the end of a circular tube member.

Moreover, a description will be supplementarily given of the attachment of the diaphragm member 15a to the circular tube member 14 with reference to FIG. 4. FIG. 4 is a diagram showing an example of a configuration in which the diaphragm member 15a is attached to the end of the circular tube member 14.

In the example of FIG. 3, the diaphragm member 15a is fixed to the end of the circular tube member 14 by the conductive adhesive 152. On the other hand, in the example of FIG. 4, the diaphragm member 15a is fixed to the end of the circular tube member 14 by a metal fixation member 140 on which threads 142 are formed. In this case, the gap between the charged particle generation space 100 and the first space 200 is closed by a sealing member 141 such as an O-ring.

Note that the supplemental description of FIG. 4 is also applied to the first aperture member 15 described above in the same way.

As described above, in the charged particle beam device 1 according to the first embodiment including the modified example, the charged particle generation space 100 and the first space 200 are isolated from each other by the first aperture member 15 (or the diaphragm member 15a), and the first space 200 and the second space 300 are isolated from each other by the second aperture member 31. The first aperture member 15 and the second aperture member 31 have the respective small apertures, but the small apertures are small or closed by the thin film. Therefore, the pumping (i.e., differential pumping) of the respective spaces with the vacuum pumps 43 and 46 enables the charged particle generation space 100 and the first space 200 to be kept in vacuo.

At this time, the sample 60 is arranged in the second space 300, i.e., in the atmospheric pressure space. Accordingly, this allows a user to freely change the observation target region of the sample 60, or to replace the sample 60 with another sample without stopping the vacuum pumps 43 and 46 or without stopping the high voltage supplied to the charged particle source 11. Further, the arrangement of the sample 60 in the atmospheric pressure space (i.e., the second space 300) facilitates an observation image of a micro region at the front surface of the sample 60 to be easily obtained, even if size of the sample 60 is so large.

As a result, according to the first embodiment, a user-friendly charged particle beam device 1 is provided.

In addition, from the viewpoint of a manufacturer of the charged particle beam device 1, the charged particle beam device 1 of the first embodiment has a great advantage that the device 1 is manufactured by modifying a part of a conventional charged particle beam device having a sample room. That is, the housing of the conventional sample room can be directly used as the support housing 20. In addition, the housing of the conventional sample room is provided with an opening part for taking in and out the sample 60. The opening part of the present embodiment can be used as an opening for inserting and attaching the insertion housing 30.

Accordingly, it becomes possible to manufacture the charged particle beam device 1 according to the embodiment only by the addition of the insertion housing 30 without greatly modifying the configuration of the conventional charged particle beam device. As a result, a reduction in the manufacturing cost can be attained.

Second Embodiment

Figure 5:
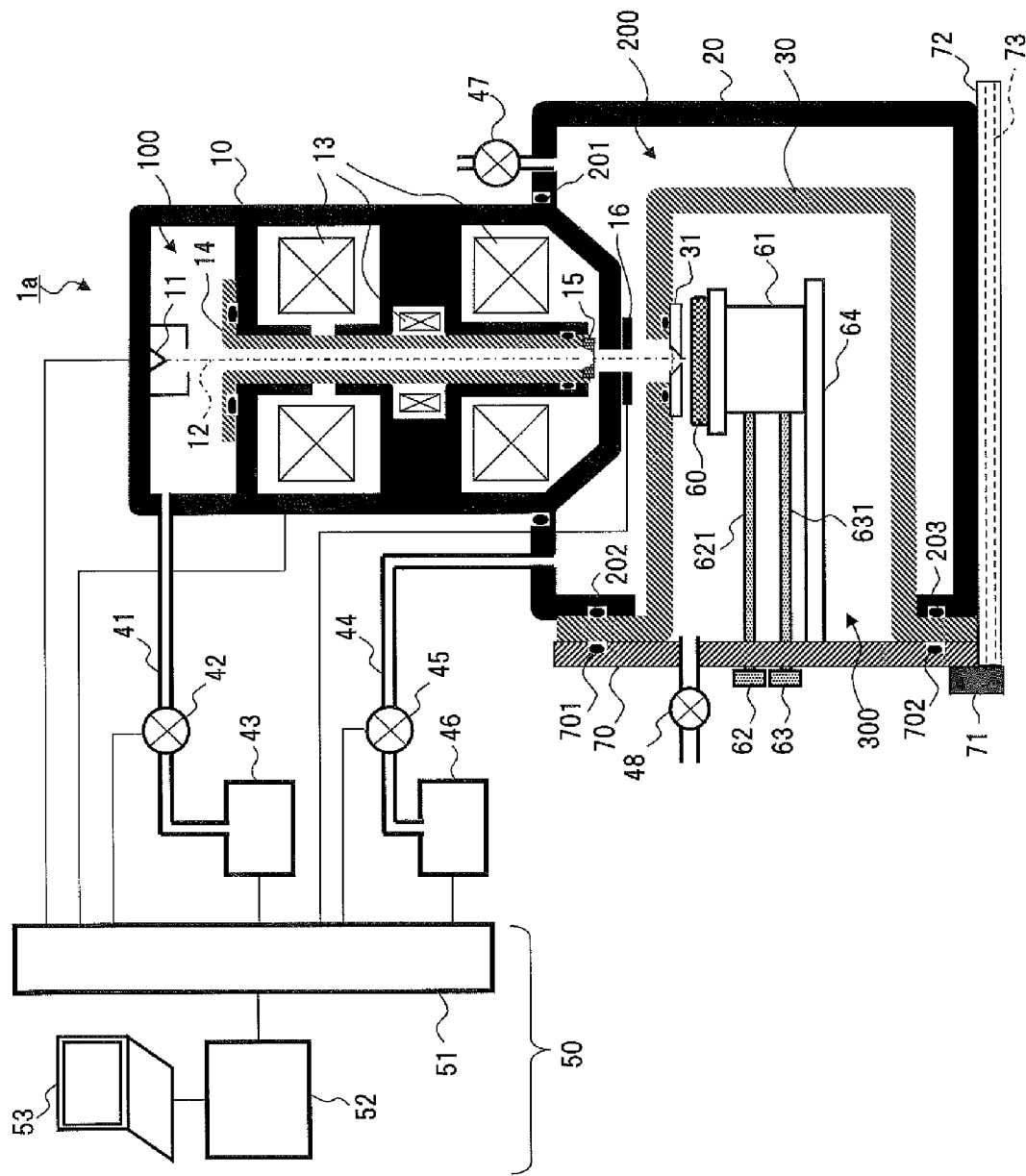
FIG. 5 is a diagram schematically showing an example of the configuration of a charged particle beam device according to a second embodiment of the present invention.

FIG. 5 is a diagram schematically showing an example of the configuration of a charged particle beam device according to a second embodiment of the present invention. Hereinafter, in the second embodiment, configurations different from those of the first embodiment will be mainly described. While, the same components as those of the first embodiment will be denoted by the same symbols and their descriptions will be omitted.

As shown in FIG. 5, a charged particle beam device 1a of the second embodiment is greatly different from the charged particle beam device 1 of the first embodiment in that the opening part of an insertion housing 30 is closed by a cover member 70. That is, since the cover member 70 is closely fixed to the insertion housing 30 via vacuum sealing members 701 and 702, a space inside the insertion housing 30, i.e., a second space 300 is closed. Note that the cover member 70 is detachably fixed to the insertion housing 30.

As shown in FIG. 5, the cover member 70 includes a pressure control valve 48 for controlling pressure inside (i.e., the second space 300) the insertion housing 30. Accordingly, the air pressure or vacuum pressure in the second space 300 can be set via controlling the opening/closing of the pressure control valve 48.

For example, when a first space 200 is evacuated by a vacuum pump 46, the second space 300 is also evacuated through a small aperture of a second aperture member 31. Herein, when the pressure inside the insertion housing 30 (i.e., the second space 300) is kept at atmospheric pressure, the pressure control valve 48 is held fully open. In contrast, when the pressure is kept at negative pressure relative to atmospheric pressure, the pressure control valve 48 may be slightly closed. Alternatively, a vacuum pump may be provided at an upstream side of the pressure control valve 48 to vacuum the second space 300.

Further, it is also possible to fill gas such as nitrogen and rare gas in the insertion housing 30 (i.e., the second space 300) by the pressure control valve 48. This procedure, for example, allows a user to slowly observe a sample 60 even susceptible to oxidation via taking enough time.

Here, the charged particle beam device 1a of the second embodiment is provided with the cover member 70. Thus, it requires a mechanism that moves the observation target region of the sample 60 from the outside of the cover member 70. Hereinafter, a description will be given of the mechanism that moves an observation target region with reference to FIG. 5.

As shown in FIG. 5, a support plate 64 that horizontally extends toward the back of the insertion housing 30 is attached inside the insertion housing 30 of the cover member 70. A sample stage 61 is mounted on the upper side of the support plate 64. That is, the support plate 64 works as a bottom plate that supports the sample stage 61.

Here, the sample stage 61 is provided with an XY driving mechanism that moves the sample 60 on a horizontal plane and a Z-axis driving mechanism that moves the sample 60 in a height direction. In addition, operation knobs 62 and 63 are arranged at the outside of the cover member 70 and coupled to the XY driving mechanism and the Z-axis driving mechanism via control rods 621 and 631, respectively. Accordingly, by appropriately operating the operation knobs 62 and 63, a user can drive the XY driving mechanism and the Z-axis driving mechanism, and thereby freely move the sample 60 in each of X, Y, and Z axis directions. Note that FIG. 5 shows one operation knob 62 alone for controlling the XY driving mechanism. However, in reality two operation knobs are disposed for controlling movement in the X-axis and Y-axis directions.

Normally, when adjusting the position of the sample 60, the user first sets an observation viewing position on the XY plane and then adjusts a position in the height direction. Accordingly, in the embodiment, the user manually moves the sample 60 in the XY directions to set an observation target region and then moves the sample 60 upward based on the height of the lower side of the second aperture member 31 and the height of the sample 60 that are calculated in advance.

Herein, if the movement driving mechanism of the sample stage 61 is controlled based on a control signal transmitted from an upper-level control unit 52, the operation knobs 62 and 63 and the control rods 621 and 631 may not be provided.

In the second embodiment, a bottom plate 72 is provided on the lower side of the support housing 20, whereby the charged particle beam device 1 is placed on a floor via the bottom plate 72. The bottom plate 72 is provided with an accommodation hole in which a horizontal support rod member 73 is accommodated from the opening part of the support housing 20 so as to be freely inserted and removed. An end of the support rod 73 positioned at the periphery of the opening part of the support housing 20 is fixed to a cover support member 71 and the lower end of the cover member 70.

That is, the lower end of the cover member 70 is fixed to both of the cover support member 71 and the support rod member 73. Therefore, the cover member 70 is held so as to stand erect with respect to the floor side in a state that the support rod member 73 fixed to the cover support member 71 is accommodated in the accommodation hole provided in the bottom plate 72. Accordingly, the user can freely take out the cover member 70 and the support plate 64 that supports the sample stage 61 together from the inside of the insertion housing 30. In other words, the support rod 73 and the accommodation hole for the support rod member 73 provided in the bottom plate 72 work as assist members that prevent the cover member 70 and the sample stage 61 from falling when removed from the inside of the insertion housing 30.

Here, the support rod member 73 is not limited to a rod member but may be a plate-like member or a comb-like member constituted of a plurality of rod members. In this case, the bottom plate 72 is, of course, provided with an accommodation hole corresponding to the plate-like member or the comb-like member.

When replacing the sample 60 in the charged particle beam device 1a configured as described above, the user first operates the operation knob 63 that controls the height of the sample stage 61 to separate the sample 60 from the second aperture member 31. Then, after confirming that the inside of the insertion housing (i.e., the second space 300) is not in a reduced pressure or a pressurized state relative to atmospheric pressure, the user removes the cover member 70 and the sample stage 61 from the insertion housing 30. At that time, the sample stage 61 is placed outside the insertion housing 30, and the user replaces the sample 60 in an easy manner.

Next, after replacing the sample 60, the user puts the cover member 70 and the sample stage 61 inside the insertion housing 30 and brings the cover member 70 into intimate contact with the insertion housing 30 to be fixed thereto. After that, by operating the operation knob 63 to align the viewing position of the sample 60, the user can quickly obtain an observation image of the sample 60. Note that before aligning the viewing position of the sample 60, the user may introduce nitrogen gas or the like into the insertion housing 30 (i.e., the second space 300), or the user may evacuate the insertion housing 30 via the pressure control valve 48.

The user's operations described above can be performed in a state that an operation such as the emission of a charged particle beam is continuously performed in a charged particle optical lens barrel 10 or in a state that the evacuation of the charged particle generation space 100 and the first space 200 is continuously performed. This allows the user to quickly replace the sample 60 and quickly obtain an observation image of the replaced sample 60.

Further, in the embodiment, the sample stage 61, the operation knobs 62 and 63, and the pressure control valve 48 are all intensively attached to the cover member 70. Accordingly, the user can operate the operation knobs 62 and 63, replace the sample 60, control the pressure control valve 48, detach a gas supply pipe, or the like from the same side of the support housing 20. As a result, operability and usability are improved for the user.

Modified Example of Second Embodiment

Figure 6:
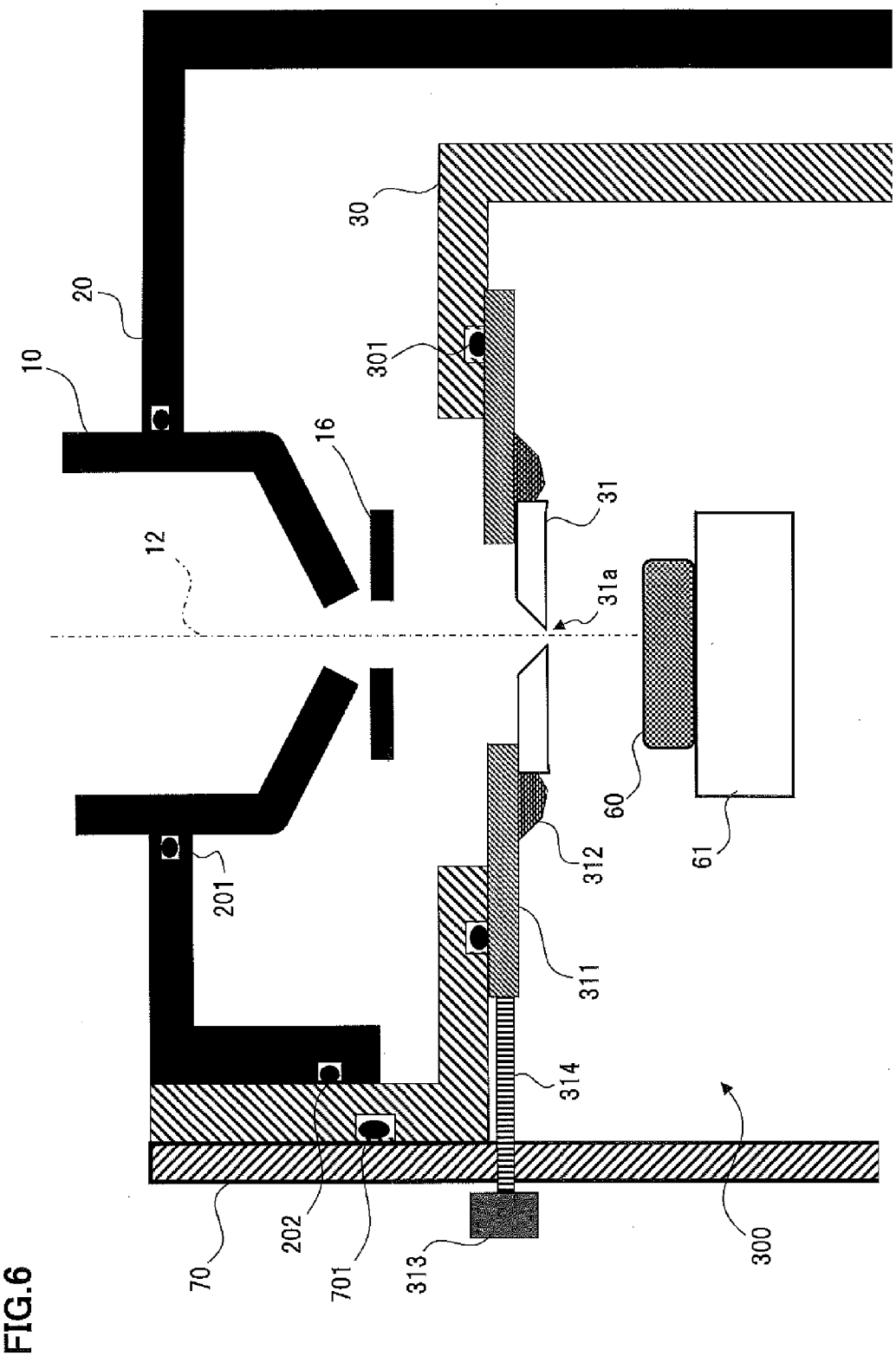
FIG. 6 is a diagram schematically showing an example of the configuration of the essential part of the charged particle beam device according to a modified example of the second embodiment of the present invention.

FIG. 6 is a diagram schematically showing an example of the configuration of the essential part of the charged particle beam device 1a according to a modified example of the second embodiment of the present invention. In the modified example of the embodiment, a position adjustment mechanism that adjusts the position of the second aperture member 31 is added to the components of the second embodiment, and other components of the modified example are the same as those of the second embodiment.

Since the second aperture member 31 is a component brought into contact with the sample 60, it may be contaminated or broken. Accordingly, it is required to assume that the second aperture member 31 is often detached to be washed or replaced. Further, when the second aperture member 31 is newly attached, it is required to perform an operation to align a light axis 12 of a primary charged particle beam irradiated from the charged particle optical lens barrel 10 with the center of a small aperture 31a of the second aperture member 31. Therefore, in the modified example of the embodiment, the position adjustment mechanism that adjusts the position of the second aperture member 31 is newly added.

In this case, since the second aperture member 31 is thin and small, it is hard to provide the movement mechanism that adjusts a position in the second aperture member 31 itself. Therefore, in the modified example, the second aperture member 31 is not directly disposed at the opening part of the insertion housing 30, but an aperture holding member 311 is interposed between the insertion housing 30 and the second aperture member 31.

More specifically, as shown in FIG. 6, the second aperture member 31 is first detachably disposed on the aperture holding member 311. Here, the second aperture member 31 may be fixed to the aperture holding member 311 by an adhesive 312 or the like for vacuum-sealing or may be fixed thereto by screws or an O-ring not shown for vacuum-sealing. In addition, the second aperture member 31 and the aperture holding member 311 are preferably made of a conductive material to prevent a charge-up due to the irradiation of the primary charged particle beam and grounded.

Further, the aperture holding member 311, on which the second aperture member 31 is disposed, is disposed on the lateral side inside the insertion housing 300 (i.e., on the side of the second space 300) so as to close the opening part provided at the upper part of the insertion housing 30. At this time, the aperture holding member 311 is disposed so as to be movable in the respective XY directions along the inside surface of the insertion housing 30, for example, movable in about ±1 cm.

Moreover, on the outside of the cover member 70 that closes the second space 300 inside the insertion housing 30, an operation knob 313 for moving the aperture holding member 311 is disposed. That is, when the user rotates the operation knob 313, a control rod 314 extends or retracts. Accordingly, the aperture holding member 311 is moved by the extension or retraction of the control rod 314. Here, the operation knob 313 may include two knobs for X and Y axis movements.

Here, a motor may be used to move the aperture holding member 311. In this case, it is not required to dispose the operation knob 313 on the cover member 70. Herein, when the motor used for the movement is controlled by a control system device 50, it becomes possible to control the movement of the aperture holding member 311, i.e., the position adjustment of the second aperture member 31 by the control system device 50.

Since the user can move the aperture holding member 311 holding the second aperture member 31 in the X and Y axis directions with the configurations described above, it becomes possible to perform the position adjustment such that the center of the small aperture 31a of the second aperture member 31 aligns with the light axis 12 of the primary charged particle beam.

Note that in the modified example of the embodiment described above, the second aperture member 31 is held by the aperture holding member 311 assuming that the second aperture member 31 is small. In contrast, the second aperture member 31 may be enlarged in size and made movable.

Third Embodiment

Figure 7:
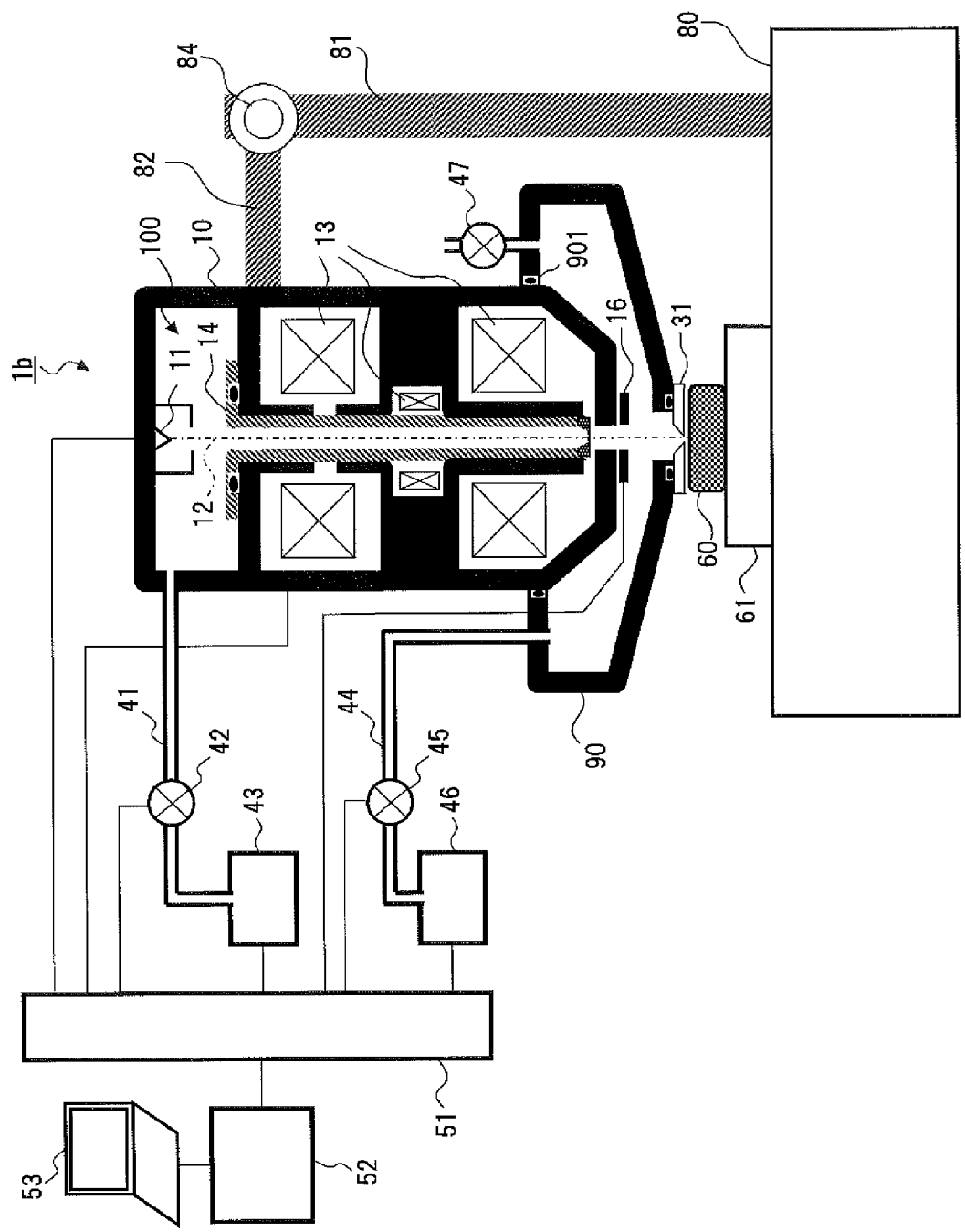
FIG. 7 is a diagram schematically showing an example of the configuration of a charged particle beam device according to a third embodiment of the present invention.

FIG. 7 is a diagram schematically showing an example of the configuration of a charged particle beam device according to a third embodiment of the present invention. Hereinafter, in the third embodiment, configurations different from those of the first embodiment will be mainly described. While, the same components as those of the first embodiments will be denoted by the same symbols and their descriptions will be omitted.

As shown in FIG. 7, a charged particle beam device 1b of the third embodiment is greatly different from the charged particle beam device 1 of the first embodiment in that the support housing 20 and the insertion housing 30 described in the first embodiment are not provided.

More specifically, in the third embodiment, provided are a base body 80 placed on a floor instead of the support housing 20, a column 81 attached to the base body 80 so as to be directed vertically upward, and a beam member 82 substantially-horizontally cantilevered by the column 81. Herein, one end of the beam member 82 is attached to the upper part of the column 81, while the other end thereof is attached to a charged particle optical lens barrel 10.

On the lower outside of the charged particle optical lens barrel 10, a lens body assist housing 90 for constituting space corresponding to the first space described in the first embodiment is attached via a vacuum seal member 901. Further, an opening part is provided at the lower part of the lens body assist housing 90 to be positioned around the center of an irradiation area to which a primary charged particle beam from the charged particle optical lens barrel 10 is irradiated. A second aperture member 31 is attached so as to close the opening part.

Here, at the central part of the second aperture member 31, a small aperture having a diameter of about 1 mm or less is provided. Further, the second aperture member 31 is attached at a position where a light axis 12 of the primary charged particle beam irradiated from the charged particle optical lens barrel 10 passes through the central part of the small aperture.

Accordingly, since the inside of the lens body assist housing 90 works the same as the first space 200 described in the first embodiment, it the inside of the housing 90 is evacuated by a vacuum pump 46. The lens body assist housing 90 is provided with a leak valve 47 for letting the inside of the lens body assist housing 90 open to the air during the maintenance or the like.

Including the configuration of a detector 16 disposed on the lower outside, the inside configuration of the charged particle optical lens barrel 10 is the same as that of the first embodiment. Accordingly, as in the first embodiment, a first aperture member 15 or a diaphragm member 15a is disposed at the lower end of a circular tube member 14 provided at the central parts of electron lenses 13. Further, a charged particle generation space 100 isolated from the inside space of the charged particle optical lens barrel 10 by the circular tube member 14 and first aperture member 15 or the diaphragm member 15a is evacuated by a vacuum pump 43.

A sample stage 61 is provided on the base body 80 under the position at which the second aperture member 31 is disposed, and a sample 60 is placed on the sample stage 61. Note there is no housing equivalent to the insertion housing 30 in the third embodiment. Thus, a main advantage of the third embodiment is that it is possible to obtain an observation image of the sample 60 large in size.

In order to take this advantage, the column 81 preferably includes a lens barrel position adjustment mechanism 84 that vertically moves a height position at which the beam member 82 is supported. In addition, if the user manually moves the sample 60 to set its position, the sample stage 61 may not be provided. Moreover, if the user manually holds the charged particle optical lens barrel 10 including the lens body assist housing 90 to which the second aperture member 31 is attached, the base body 80, the column 81, and the beam member 82 may not be required.

According to the third embodiment described hereinbefore, as in the first embodiment, the user can replace the sample 60 or change an observation target region in a state that an operation such as the emission of a primary charged particle beam is continuously performed in the charged particle optical lens barrel 10 or in a state that the evacuation of the charged particle generation space 100 and the inside space of the lens body assist housing 90 is continuously performed. This allows the user to quickly and easily replace the sample 60 or change the observation target region. In other words, a user-friendly charged particle beam device is provided in the embodiment.

It should be noted that the present invention is not limited to the embodiments described hereinbefore but includes various modified examples. For example, the embodiments are described in detail only for the purpose of easily understanding the present invention and are not necessarily limited to those including all the configurations described hereinbefore. Further, the configuration of one of the embodiments may be replaced with the configuration of another of the embodiments. Moreover, the configuration of one of the embodiments may be added to the configuration of another of the embodiments.

EXPLANATION OF REFERENCES 1a, 1b: charged particle beam device
10: charged particle optical lens barrel
11: charged particle source
12: light axis
13: electron lens
14: circular tube member
15: first aperture member
15a: diaphragm member
16: detector
20: support housing
30: insertion housing
31: second aperture member
32: mating part
33: holding part
34: insertion part
41: vacuum piping
42, 45: vacuum valve
43, 46: vacuum pump
44: vacuum piping
46: vacuum pump
47: leak valve
48: pressure control valve
50: control system device
51: lower-level control unit
52: upper-level control unit
53: personal computer
60: sample
61: sample stage
64: support plate
70: cover member
71: cover support member
72: bottom plate
73: support rod member
80: base body
81: column
82: beam member
84: lens barrel position adjustment mechanism
90: lens body assist housing
100: charged particle generation space
131: objective lens
140: metal fixation member
141: sealing member
142: thread
150: diaphragm
151: diaphragm holding member
200: first space
300: second space
310: flexible member
311: aperture holding member

The invention claimed is:

1. A charged particle beam device comprising:
a charged particle optical lens barrel accommodating a charged particle source and electron lenses including an objective lens;
a support housing equipped with the charged particle optical lens barrel on an upper side thereof and having an opening part at a lateral side thereof;
an insertion housing having a lateral opening part at a lateral side thereof and an upper opening part at an upper side thereof, and being inserted in the support housing so that the opening part of the insertion housing is positioned in a same direction as the opening part of the support housing to face each other, to thereby close the opening part of the support housing, and wherein the upper opening part is arranged at an irradiation area to which a primary charged particle beam is irradiated in a state that the insertion housing is inserted in the support housing;
a first aperture member having a small aperture at a central part thereof and disposed in a vicinity of a center of a magnetic field of the objective lens in the charged particle optical lens barrel so as to substantially isolate a space accommodating the charged particle source;
a second aperture member having a small aperture at a central part thereof and disposed so as to substantially close the upper opening part of the insertion housing; and
a detector that detects secondary charged particles emitted from a sample when the primary charged particle beam emitted from the charged particle source passes through the small aperture of the first aperture member and the small aperture of the second aperture member and is irradiated to the sample arranged in contact with or arranged in close vicinity to a lower side of the second aperture member.

2. The charged particle beam device according to claim 1, further comprising:
a first space in which the primary charged particle beam is emitted from the charged particle source and the primary charged particle beam passes in the charged particle optical lens barrel forms a substantially sealed space except for the small aperture of the first aperture member,
a second space defined between the support housing and the insertion housing forms a substantially sealed space except for the small apertures of the first aperture member and the second aperture member, and at least one vacuum pump for evacuating the first space to a first vacuum pressure and the second space to a second vacuum pressure, wherein the first vacuum pressure is higher than the second vacuum pressure.

3. The charged particle beam device according to claim 1, further comprising:

a thin film that closes the small aperture of the first aperture member.

4. The charged particle beam device according to claim 3, wherein the thin film is made of a material which is selected from silicon, silicon oxide, silicon nitride, and silicon carbide.

5. The charged particle beam device according to claim 3, wherein the thin film has a thickness of 100 nm or less.

6. The charged particle beam device according to claim 1, wherein both of the first aperture member and the second aperture member have conductivity and are grounded.

7. The charged particle beam device according to claim 1, wherein both of a diameter of the small aperture of the first aperture member and a diameter of the small aperture of the second aperture member are 1 mm or less.

8. The charged particle beam device according to claim 1, further comprising:

a cover member that closes the opening part of the insertion housing.

9. The charged particle beam device according to claim 8, wherein the cover member has a piping with a pressure control valve for controlling pressure inside the insertion housing closed by the cover member.

10. The charged particle beam device according to claim 1, wherein the sample is located outside of a space formed between the support housing and the insertion housing.

11. A charged particle beam device comprising:

a charged particle optical lens barrel accommodating a charged particle source and electron lenses including an objective lens, and having an emission port from which a primary charged particle beam is emitted;

an assist housing equipped with the charged particle optical lens barrel and having a lower opening part provided at an irradiation area to which a primary charged particle beam is irradiated, the irradiation area being located on an inside surface thereof, and wherein the assist housing forms a substantially sealed space surrounding the emission port of the charged particle optical lens barrel;

a first aperture member having a small aperture at a central part thereof and disposed in a vicinity of a center of a magnetic field of the objective lens in the charged particle optical lens barrel so as to substantially isolate a space accommodating the charged particle source;

a second aperture member having a small aperture at a central part thereof and disposed so as to substantially close the lower opening part of the assist housing; and a detector that detects secondary charged particles emitted from a sample that is disposed under the second aperture in a state of being exposed to atmospheric pressure outside of the assist housing during the emission of the primary charged particle beam.

12. The charged particle beam device according to claim 11, further comprising:

a beam member to which the charged particle optical lens barrel is attached;

a column having an adjustment member which connect the beam and the column, and supporting the beam member; and a base body that supports the column; and wherein a height position of the beam member supported by the column is adjustable by the adjustment member.

13. The charged particle beam device according to claim 11, further comprising a sample stage on which the sample is placed and moves the sample at least the vertical direction.

14. A charged particle beam device comprising:

a charged particle optical lens barrel having a charged particle source and electron lenses including an objective lens;

a first housing having an upper side with which the charged particle optical lens barrel is equipped and a lateral side with an opening;

a second housing having a lateral side with a lateral opening and an upper side with an upper opening, wherein the second housing substantially closes the opening of the first housing and forms a first space between the first housing when arranged in the first housing;

a first aperture member having an aperture at a central part thereof and disposed above the upper opening part of the insertion housing so as to substantially isolate a second space accommodating the charged particle source from the first space;

a second aperture member having an aperture at a central part thereof and disposed so as to substantially close the upper opening part of the second housing; and a detector that detects secondary charged particles emitted from a sample disposed under the upper opening of the second housing.

15. The charged particle beam device according to claim 14, wherein the sample is disposed in a state of being exposed to atmospheric pressure outside of the first space during the emission of the primary charged particle beam.

* * * * *